(12) United States Patent
Wang et al.

(10) Patent No.: US 11,326,245 B2
(45) Date of Patent: May 10, 2022

(54) MASKS FOR FABRICATION OF ORGANIC LIGHTING-EMITTING DIODE DEVICES

(71) Applicant: Kunshan Go-Visionox Opto-Electronics Co., Ltd., Kunshan (CN)

(72) Inventors: Mengfan Wang, Kunshan (CN); Guobing Wang, Kunshan (CN); Qian Su, Kunshan (CN); Jinku Li, Kunshan (CN); Menghua Kang, Kunshan (CN); Xin Ye, Kunshan (CN)

(73) Assignee: KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 127 days.

(21) Appl. No.: 16/424,493

(22) Filed: May 29, 2019

(65) Prior Publication Data

US 2019/0276927 A1 Sep. 12, 2019

Related U.S. Application Data

(63) Continuation of application No. PCT/CN2018/113113, filed on Oct. 31, 2018.

(30) Foreign Application Priority Data

May 14, 2018 (CN) .......................... 201820714454.9

(51) Int. Cl.
*C23C 14/04* (2006.01)
*H01L 51/56* (2006.01)
*H01L 51/00* (2006.01)

(52) U.S. Cl.
CPC ............ *C23C 14/042* (2013.01); *H01L 51/56* (2013.01); *H01L 51/001* (2013.01); *H01L 51/0011* (2013.01)

(58) Field of Classification Search
CPC .......................... H01L 51/0011; C23C 14/042
See application file for complete search history.

(56) References Cited

U.S. PATENT DOCUMENTS

2005/0211981 A1* 9/2005 Yotsuya ................ C23C 14/042
257/64
2010/0192856 A1 8/2010 Sung et al.
(Continued)

FOREIGN PATENT DOCUMENTS

CN 104630705 A 5/2015
CN 105803389 A 7/2016
(Continued)

*Primary Examiner* — Dah-Wei D. Yuan
*Assistant Examiner* — Stephen A Kitt
(74) *Attorney, Agent, or Firm* — Kilpatrick Townsend & Stockton

(57) ABSTRACT

A mask includes a mask body and at least one sub-mask provided on the mask body. The sub-mask includes an evaporation zone and a shield portion. The shield portion is provided with at least one groove in a thickness direction of the sub-mask. The groove has a depth smaller than a thickness of the mask body. Since the shield portion is provided with the groove, and a single groove has a depth smaller than the thickness of the mask body, it not only ensures that there is no pixel evaporated onto a substrate at the shield portion, but also reduces the thickness of the shield portion, thereby reduces weight thereof, lowers the weight difference between the shield portion and the evaporation zone and reduces the stress concentration on the shield portion, resulting in that the mask body is evenly stressed during tensioning.

18 Claims, 5 Drawing Sheets

(56) References Cited

U.S. PATENT DOCUMENTS

| | | | |
|---|---|---|---|
| 2014/0150721 A1* | 6/2014 | Oh | H01L 51/0011 118/504 |
| 2015/0040826 A1* | 2/2015 | Jung | C23F 1/02 118/504 |
| 2015/0101536 A1* | 4/2015 | Han | C23C 14/042 118/721 |
| 2016/0263607 A1 | 9/2016 | Wang et al. | |
| 2018/0155818 A1* | 6/2018 | Mu | C23C 14/12 |
| 2019/0093216 A1* | 3/2019 | Zhou | C23C 16/042 |
| 2019/0203336 A1* | 7/2019 | Xu | C23C 14/24 |

FOREIGN PATENT DOCUMENTS

| | | |
|---|---|---|
| CN | 108642440 A | 10/2018 |
| KR | 20110135552 A | 12/2011 |

\* cited by examiner

MASKS FOR FABRICATION OF ORGANIC LIGHTING-EMITTING DIODE DEVICES

CROSS-REFERENCES TO RELATED APPLICATIONS

This application is continuation of International Application No. PCT/CN2018/113113, filed on Oct. 31, 2018, which claims priority to Chinese Patent Application No. 201820714454.9, filed on May 14, 2018, both of which are hereby incorporated by reference in their entireties.

FIELD

The present disclosure relates to the organic light-emitting display technology.

BACKGROUND

An organic light-emitting diode (OLED) display device is also referred to as an organic electroluminescent display device or an organic light-emitting semiconductor device. Since OLED display devices exhibit numerous characteristics such as lower driving voltage, autonomous luminescence, a wider viewing angle, a higher efficiency, a higher reaction speed, and an easier achieving full color large-area wall-mounted display and flexible display, they are gradually substituting for liquid crystal displays (LCD).

In the manufacturing technology for OLED, a mask for vacuum evaporation is a critical component, and is used for controlling the position where the organic material is deposited on the substrate. The mask mainly includes a common metal mask (CMM) for common layer evaporation and a fine metal mask (FMM) for light emitting layer evaporation.

SUMMARY

Based on this, the present disclosure provides a mask for solving the problem of wrinkles of the mask when tensioned, and improving the precision of the position where subsequent evaporation of the display screen pixel takes place.

To achieve the above objective, the present disclosure provides a mask. The mask includes: a mask body; and at least one sub-mask provided on the mask body, wherein the sub-mask includes an evaporation zone and a shield portion, the shield portion is provided with at least one groove in a thickness direction of the sub-mask, and the groove has a depth smaller than a thickness of the mask body.

In an embodiment, the shield portion has an evaporation surface facing to an evaporation source and a glass surface facing away from the evaporation source, and the groove is provided in the evaporation surface.

In an embodiment, the number of the groove is one, and a bottom wall of the groove is the evaporation surface of the shield portion.

In an embodiment, the number of the groove is at least two, and every two adjacent grooves are spaced apart on a plane where the sub-mask lies.

In an embodiment, the shield portion has an evaporation surface facing to an evaporation source and a glass surface facing away from the evaporation source, and the groove is provided in the glass surface.

In an embodiment, the shield portion has an evaporation surface facing to an evaporation source and a glass surface facing away from the evaporation source, the at least one groove comprises a first groove provided in the evaporation surface and a second groove provided in the glass surface, and a bottom wall of the first groove and a bottom wall of the second groove are spaced apart along a thickness direction of the shield portion.

In an embodiment, a projection of the first groove on a plane where the sub-mask lies and a projection of the second groove on the plane where the sub-mask lies are at least partially overlapped.

In an embodiment, a projection of the first groove on a plane where the sub-mask lies and a projection of the second groove on the plane where the sub-mask lies do not have an overlapped area.

In an embodiment, the first groove has a depth greater than or equal to that of the second groove.

In an embodiment, the first groove and the second groove each has a depth equal to or greater than half of the thickness of the mask body.

In an embodiment, the groove has a cross section with a shape of polygonal or circular or elliptical.

In an embodiment, the mask body has a first centerline and a second centerline perpendicular to each other;
the mask body is provided with two sets of the sub-masks, each set of the sub-masks includes at least one sub-mask, every two adjacent sub-masks are spaced apart, and the two sets of the sub-masks are axis-symmetrical about the first centerline and axis-symmetrical about the second centerline, respectively.

In an embodiment, the mask body has a centerline and is provided with a row of sub-masks, and the sub-masks located on a same side of the centerline have their shield portions all facing away from or all facing to the centerline.

In an embodiment, the mask body has a centerline and is provided with a row of sub-masks, the sub-masks on a same side of the centerline comprises a plurality of subsets of the sub-masks, each subset of the sub-masks includes two adjacent sub-masks, and the shield portions of the two adjacent sub-masks are disposed opposing to each other.

In an embodiment, the mask body has a centerline and is provided with multiple rows of sub-masks, and the sub-masks located on a same side of the centerline have their shield portions all facing away from or all facing to the centerline.

In an embodiment, the mask body has a centerline and is provided with multiple rows of sub-masks, the sub-masks on a same side of the centerline comprises a plurality of subsets of the sub-masks, each subset of the sub-masks includes two adjacent sub-masks, and the shield portions of the two adjacent sub-masks are disposed opposing to each other.

In an embodiment, the mask body has a first centerline and a second centerline perpendicular to each other, and the sub-masks are symmetric about the first centerline or the second centerline.

In an embodiment, the mask further includes a mask frame to which the mask body is fixed.

According to the embodiments of the present disclosure, since the shield portion is provided with the groove, and a single groove has a depth smaller than the thickness of the mask body (the groove does not penetrate the mask body in the thickness direction), it not only ensures that there is no pixel evaporated onto a substrate at the shield portion, but also reduces the thickness of the shield portion, thereby reduces weight thereof, lowers the weight difference between the shield portion and the evaporation zone and reduces the stress concentration on the shield portion, resulting in that the mask body is evenly stressed during tensioning, which further reduces the wrinkle phenomenon of the mask body during tensioning.

DETAILED DESCRIPTION OF THE INVENTION

Figure 1:
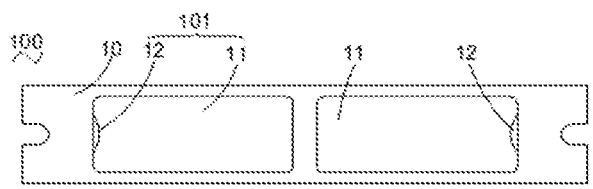
FIG. 1 is a structural schematic view of a mask according to an embodiment of the present disclosure.

As described above, masks used during deposition processes of OLED fabrication. It was found that, in conventional processes, when a mask is tensioned, profiled areas thereof are prone to wrinkles, resulting in a decrease in the precision of the position where subsequent evaporation of the display screen pixel takes place.

The disclosure will be described more fully hereinafter with reference to the accompanying drawings. Preferred embodiments of the present disclosure are given in the drawings. However, the present disclosure may be embodied in many different forms and is not limited to the embodiments described herein. Rather, these embodiments are provided so that the understanding of the disclosure will be more thorough.

It should be noted that when an element is referred to as being "fixed" to another element, it may be directly on the other element or an intermediate element may be present. When an element is considered to be "connected" to another element, it can be directly connected to the other element or an intermediate element may be present. The terms "vertical," "horizontal," "left," "right," and the like, as used herein, are for illustrative purposes only.

All technical and scientific terms used herein have the same meaning as commonly understood by one of ordinary skill in the art to which this disclosure belongs. The terminology used in the description of the present disclosure is for the purpose of describing particular embodiments, and is not intended to limit the disclosure. The term "and/or" used herein comprises any and all combinations of one or more of the associated listed items.

As described in Background, with the mask of the prior art, there is a problem of wrinkles when tensioning. The inventors have found that the root cause of such a problem is that the grooved screen body needs to be opened at the corresponding position during the manufacturing process, that is, there is a shield portion (i.e., area where no evaporation holes are provided) on the mask. Since the structure of the shield portion and the evaporation zone are largely different, the stress is concentrated on the shield portion. When this happens, the entire mask is stressed unevenly which may cause the wrinkles.

Figure 2:
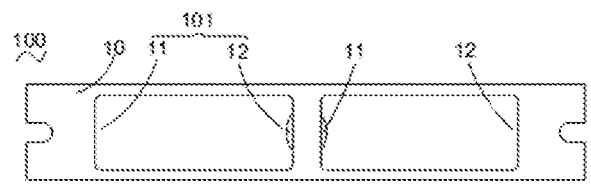
FIG. 2 is a structural schematic view of a mask according to another embodiment of the present disclosure.
Figure 3:
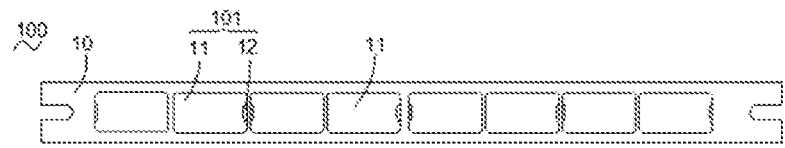
FIG. 3 is a structural schematic view of a mask according to yet another embodiment of the present disclosure.

Referring to FIG. 1 to FIG. 3, based on the above reasons, this embodiment of the present disclosure provides a mask 100. The mask 100 includes a mask body 10 on which at least one sub-mask 101 is provided. Each sub-mask 101 includes an evaporation zone 11 and a shield portion 12. The shield portion 12 is configured to form a slotting zone of a profiled screen. In the thickness direction of the sub-mask 101, the shield portion 12 is provided with at least one groove 121 (see FIG. 6). The groove 121 has a depth smaller than the thickness of the mask body 10.

According to the mask 100 provided in this embodiment, since the shield portion 12 is provided with a groove 121 which has a depth smaller than the thickness of the mask body 10 (the groove 121 does not penetrate the mask body 10 in the thickness direction), it not only ensures that there is no pixel evaporated onto the substrate at the shield portion 12, but also reduces the thickness of the shield portion 12, thereby reduces the weight of the shield portion 12 and lowers the weight difference between the shield portion 12 and the evaporation zone 11, resulting in that the mask body 10 is evenly stressed during tensioning, which further reduces the wrinkle phenomenon of the mask body 10 during tensioning.

In this embodiment, the shape of the mask body 10 is not limited, e.g., may be a regular rectangular or circular shape. In other embodiments, the mask 10 in other irregular shapes, such as a quadrangular-like shape in which two opposite sides are in straight lines while other two sides are in arcuate special-shapes, may be used. Further, the shape of the sub-mask 101 is not limited, for example, it may be a rectangle. In this case, the evaporation zone 11 has an opening provided in one side or a plurality of sides of the evaporation zone 11. The shape of the shield portion 12 of the sub-mask 101 is also not limited, for example, it may be an arcuate shield portion 12 or a polygonal shield portion 12.

Specifically, the mask body 10 is provided with at least two sub-masks 101 with a spacing between each adjacent two sub-masks 101.

The mask body 10 has two sets of sub-masks 101, each set of sub-masks 101 including at least one sub-mask 101. The mask body 10 has a first centerline and a second centerline perpendicular to each other, and the two sets of the sub-masks are axis-symmetrical about the first centerline, and are also axis-symmetrical about the second centerline.

Since the two sets of sub-masks 101 are axially symmetrically arranged with respect to both the first centerline and the second centerline, the number of the shield portions 12 located on each of both sides of the first centerline and the second centerline is the same. At this time, the mask body 10 is uniformly stressed on both sides of the first centerline and the second centerline when tensioning, which further reduces the wrinkles of the position of the shield portion 12, and the precision of tensioning is improved, thereby also obtaining higher precision of the position where subsequent evaporation of the display screen pixel take place, and improving the display effect of the open zone (i.e., the special-shaped zone) of the subsequent display screen.

In an embodiment, referring to FIG. 1, the mask body 10 is provided with a row of the sub-masks 101. If the line connecting the centers of the left and right sides and the line connecting the centers of upper and lower sides of the mask body 10 as shown in FIG. 1 are regarded as the first centerline and the second centerline, respectively, the shield portions 12 of the sub-masks 101 on the same side of the second centerline are all facing away from the second centerline.

In another embodiment, referring to FIG. 2, the mask body 10 is provided with a row of the sub mask 101. If the line connecting the centers of the left and right sides and the line connecting the centers of upper and lower sides of the mask body 10 as shown in FIG. 2 are regarded as the first centerline and the second centerline, respectively, the shield portions 12 of the sub-masks 101 on the same side of the second centerline are all facing to the second centerline.

In another embodiment, referring to FIG. 3, the mask body 10 is provided with a row of the sub-masks 101. If the line connecting the centers of the left and right sides and the line connecting the centers of upper and lower sides of the mask body 10 as shown in FIG. 3 are regarded as the first centerline and the second centerline, respectively, the sub-masks 101 on the same side of the centerline are provided with a plurality of subset of sub-masks 101 each including two adjacent sub-masks 101, with two sub-masks 101 of each subset of sub-masks 101 having oppositely disposed shield portions.

Figure 4:
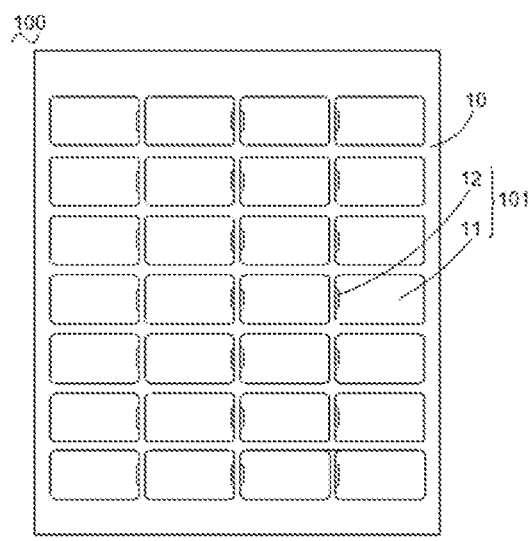
FIG. 4 is a structural schematic view of a mask according to yet another embodiment of the present disclosure.

In yet another embodiment, referring to FIG. 4, the mask body 10 is provided with a row of the sub-masks 101. If the line connecting the centers of the left and right sides and the line connecting the centers of upper and lower sides of the mask body 10 as shown in FIG. 4 are regarded as the first centerline and the second centerline, respectively, the shield portions 12 of the sub-mask 101 on the same side of the second centerline are facing to the second centerline. In another embodiment, the shield portions 12 of the sub-mask 101 located on the same side of the second centerline may also be facing away from the second centerline. In another embodiment, the sub-mask 101 on the same side of the second centerline in each row may also be disposed to include a plurality of subsets of sub-masks 101, each subset includes two adjacent sub-masks 101, and the shielding portions 12 of the two adjacent sub-masks 101 of each subset are disposed opposing to each other.

Figure 5:
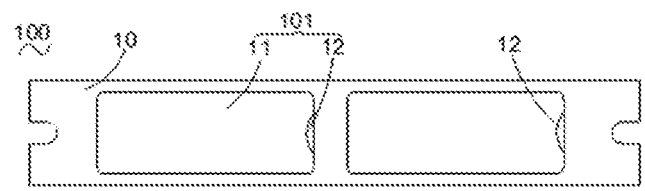
FIG. 5 is a structural schematic view of a mask according to yet another embodiment of the present disclosure.

In other embodiments, referring to FIG. 5, the two sets of sub-masks 101 can be disposed symmetrically only with respect to one of the centerlines when the sum of the two sets of sub-masks 101 is still even. If the line connecting the centers of the left and right sides and the line connecting the centers of upper and lower sides of the mask body 10 as shown in FIG. 4 are regarded as the first centerline and the second centerline, respectively, the two sets of sub-masks 101 are only axisymmetric about the first centerline, and are not axisymmetric about the second centerline. In another embodiment, the two sets of sub-masks 101 may be only axisymmetric about the second centerline, and are not axisymmetric about the first centerline.

In other embodiments, the number of sub-masks 101 may be chosen to be odd, in which case the sub-mask 101 is only symmetrical about one of the centerlines and asymmetric about the other.

In other embodiments, it is also possible to provide two sets of sub-masks 101 that are disposed asymmetrically with respect to both the first and the second centerline.

In this embodiment, the mask 100 further comprises a mask frame to which one mask body 10 or a plurality of mask main bodies 10 arranged side by side are fixedly connected. Preferably, the mask 100 may be a general metal mask or a precision metal mask.

Specifically, the shield portion 12 has an evaporation surface 122 and a glass surface 123 which are respectively located on opposite sides of the shield portion 12. The evaporation surface 122 is facing to the evaporation source, and the glass surface 123 is facing away from the evaporation source.

More specifically, the groove 121 is provided in the shield portion 12 in one of such three manners:

1. The groove 121 is only provided in the evaporation surface 122;
2. The groove 121 is only provided in the glass surface 123;
3. The grooves 121 are simultaneously provided in both the evaporation surface 122 and the glass surface 123.

Figure 6:
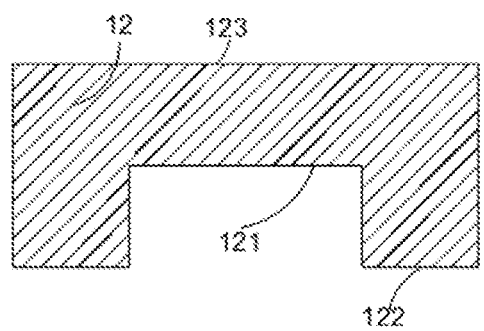
FIG. 6 is a longitudinal sectional view of the shield portion of a mask according to an embodiment of the present disclosure.

Referring to FIG. 6, in an embodiment, the groove 121 is provided in the evaporation surface 122, i.e. only on the evaporation surface 122 forms a groove 121.

Specifically, the number of the groove 121 provided in the evaporation surface 122 is one. This groove 121 is provided in the evaporation surface 122 in an entire surface half-cutting manner (that is, the depth of the groove 121 is smaller than the shield portion 12). In this embodiment, the groove 121 is disposed to cover the entire area of the evaporation surface 122, or to cover the most area of the evaporation surface 122, and the cross-sectional shape of the groove may be polygonal (such as triangular, circular or elliptical shape) or circular or elliptical shape. When the groove 121 covers the entire area of the evaporation surface 122, the bottom wall of the groove 121 has exactly the same size as the evaporation surface 122 of the shield portion 12, thus the bottom wall of the groove 121 may serve as the evaporation surface of the shield portion 12.

Figure 7:
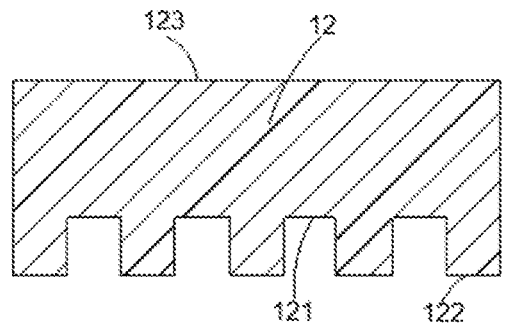
FIG. 7 is a longitudinal sectional view of the shield portion of a mask according to another embodiment of the present disclosure.

Referring to FIG. 7, in another embodiment, the number of the groove provided in the evaporation surface 122 is at least two. A spacing is provided between each adjacent two grooves on a plane of the sub-mask. At least two grooves 121 are provided in the evaporation surface 122 in a strip half-cutting or dot half-cutting manner. The cross-sectional shape of the groove 121 is a long strip when forming grooves 121 in a strip half-cutting manner; the cross-sectional shape of the groove 121 is a circular or elliptical shape when forming grooves 121 in a dot half-cutting manner. In other embodiment, the long side of the strip of the cross section of the groove 121 extends in the direction of the long side of the mask body when forming grooves 121 in a strip half-cutting manner, which further reduce the wrinkles in tensioning of mask.

Figure 8:
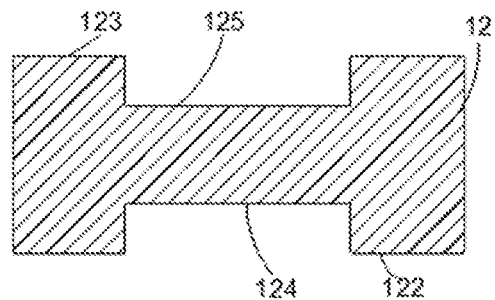
FIG. 8 is a longitudinal sectional view of the shield portion of a mask according to yet another embodiment of the present disclosure.

Referring to FIG. 8, in yet another embodiment, the grooves 121 are simultaneously provided in both the evaporation surface 122 and the glass surface 123, i.e., on the evaporation surface 122 and the glass surface 123 both forms a groove 121, which further reduces the influence of the mask on the hardness of the mask 100 itself after tensioning of the task, thereby further reducing the wrinkles. For example, when the groove 121 is only provided in the evaporation surface 122, the hardness of the evaporation surface 122 is smaller than that of the glass surface 123, thus there is a risk of breaking to some extent, so does the case when the groove 121 is only opened on the glass surface 123.

Specifically, the grooves 121 comprise a first groove 124 having a bottom wall and a second groove 125 having a bottom wall. The first groove 124 is provided in the evaporation surface 122, and the second groove 125 is provided in the glass surface 123. The first groove 124 and the second groove 125 are spaced apart from each other in the thickness direction of the shield portion 12, that is, the bottom wall of the first groove 124 and of the second groove 125 are spaced apart to ensure that there is no mutual communication between any one of the first grooves 124 and any one of the second grooves 125 in the thickness direction of the shield portion 12, thereby preventing the pixel from being evaporated onto the substrate.

Specifically, the depths of the first groove 124 and the second groove 125 along the thickness direction of the shield portion 12 may be the same or different, and the cross-sectional shapes of the first groove 124 and the second groove 125 may be the same or different. More specifically, the depth of the first groove 124 is greater than or equal to that of the second groove 125. The depth of the first groove 124 and the second groove 125 both are equal to or greater than half of the thickness of the mask body 10.

Referring to FIG. 8, in this embodiment, the number of the first groove 124 and the second groove 125 is one. Specifically, each of the first grooves 124 has a first projection toward a plane of the sub-mask 101, and each of the second grooves 125 has a second projection toward a plane of the sub-mask 101. The first projection and the second projection are at least partially overlapped. The sum of the depths of the first groove 124 and the second groove 125 in the thickness direction of the shield portion 12 is smaller than the thickness of the shield portion 12.

Specifically, the first groove 124 covers the most or entire area of the evaporation surface 122, and the second groove 125 covers the most or entire area of glass surface 123, and the first projection completely overlaps the second projection. It can be understood that in other embodiments, the first projection and the second projection may not be completely overlapped, and may be only partially overlapped.

In yet another embodiment, the number of the first groove 124 and the second groove 125 are both at least two. Specifically, each of the first grooves 124 has a first projection toward a plane of the sub-mask 101, and each of the second grooves 125 has a second projection toward a plane of the sub-mask 101. The first projection and the second projection are at least partially overlapped. The sum of the depths of the first groove 124 and the second groove 125 in the thickness direction of the shield portion 12 is smaller than the thickness of the shield portion 12.

Specifically, the first projection completely overlaps the second projection. It can be understood that in other embodiments, the first projection and the second projection may not be completely overlapped, and may be only partially overlapped.

In this embodiment, the number of the first groove 124 and the second groove 125 may be the same or different, for example, the number of the first groove 124 is two while the second groove 125 is also two, or the number of the first groove 124 is two while the second groove 125 is three.

In yet another embodiment, the number of the first groove 124 and the second groove 125 is one. The first grooves 124 has a first projection toward a plane of the sub-mask 101, and the second grooves 125 has a second projection toward a plane of the sub-mask 101. The first projection and the second projection are alternately arranged, that is, there is no overlapping area between the first projection and the second projection.

It can be understood that when the first projection and the second projection are alternately arranged, the first groove 124 and the second groove 125 are staggered from each other on a plane of the sub-mask 101. Then the sum of the depths of the adjacent first groove 124 and the second groove 125 may be set to be larger than the thickness of the shield portion 12, which does not cause the shield portion 12 to penetrate in the thickness direction, and thus does not affect the subsequent evaporation.

Figure 9:
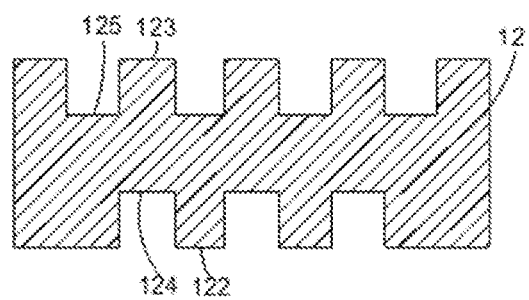
FIG. 9 is a longitudinal sectional view of the shield portion of a mask according to yet another embodiment of the present disclosure.

Referring to FIG. 9, in another embodiment, the number of the first groove 124 and the second groove 125 are both at least two. The first grooves 124 has a first projection toward a plane of the shield portion 12, and each of the second grooves 125 has a second projection toward a plane of the shield portion 12. The first projection and the second projection are staggered from each other. Then the sum of the depths of the adjacent first groove 124 and the second groove 125 may be set to be larger than the thickness of the shield portion 12, which does not cause the shield portion 12 to penetrate in the thickness direction, and thus does not affect the subsequent evaporation.

The mask provided in the above embodiments of the present disclosure has at least the following beneficial effects:

the weight difference between the shield portion 12 and the evaporation zone 11 is small and the stress concentration on shield portion 12 is reduced, resulting in that the mask body 10 is evenly stressed during tensioning, which further reduces the wrinkle phenomenon of the mask body 10 during tensioning; When the two sets of sub-masks 101 are axially symmetrically arranged with respect to the first centerline and the second centerline, the mask body 10 is uniformly stressed on both sides of the first centerline and the second centerline when tensioning, which further reduces the wrinkles of the position of the shield portion 12; When the grooves 121 are simultaneously provided in both the evaporation surface 122 and the glass surface 123, which further reduces the influence of the mask on the hardness of the mask 100 itself after tensioning of the task, thereby further reducing the wrinkles.

The technical features of the above-described embodiments may be combined in any combination. For the sake of brevity of description, all possible combinations of the technical features in the above embodiments are not described. However, as long as there is no contradiction in the combination of these technical features, it should be considered as the scope of the present specification.

The above embodiments are merely illustrative of several embodiments of the present disclosure, and are not to be construed as limiting the scope of the disclosure. It should be noted that a number of variations and modifications may be made by those skilled in the art without departing from the scope of the present disclosure. Therefore, the scope of the disclosure should be determined by the appended claims.

The invention claimed is:

1. A mask, comprising:
 a mask body; and
 at least one sub-mask provided on the mask body, wherein the sub-mask includes an evaporation zone and a shield portion, the shield portion is configured to form a slotting zone of a profiled screen, the shield portion is provided with at least one groove in a thickness direction of the sub-mask, and the groove has a depth smaller than a thickness of the mask body; and the shield portion is an arcuate shield portion having an arcuate edge and a straight edge, and the arcuate edge protrudes away from the straight edge in a length direction of the sub-mask and fits an edge of the evaporation zone,
 wherein the shield portion has an evaporation surface facing to an evaporation source and a glass-facing surface facing away from the evaporation source, the at least one groove comprises a first groove provided in the evaporation surface and a second groove provided in the glass-facing surface, and a bottom wall of the first groove and a bottom wall of the second groove are spaced apart along a thickness direction of the shield portion.

2. The mask of claim 1, wherein the number of the groove is at least two, and every two adjacent grooves are spaced apart on a plane where the sub-mask lies.

3. The mask of claim 1, wherein a projection of the first groove on a plane where the sub-mask lies and a projection of the second groove on the plane where the sub-mask lies are at least partially overlapped.

4. The mask of claim 1, wherein a projection of the first groove on a plane where the sub-mask lies and a projection of the second groove on the plane where the sub-mask lies do not have an overlapped area.

5. The mask of claim 1, wherein the first groove has a depth greater than or equal to that of the second groove.

6. The mask of claim 5, wherein the first groove has a depth greater than that of the second groove.

7. The mask of claim 1, wherein the first groove and the second groove each has a depth equal to or greater than half of the thickness of the mask body.

8. The mask of claim 1, wherein the groove has a cross section with a shape that is polygonal or circular or elliptical.

9. The mask of claim 1, wherein the mask body has a first centerline and a second centerline perpendicular to each other;
the mask body is provided with two sets of the sub-masks, each set of the sub-masks includes at least one sub-mask, every two adjacent sub-masks are spaced apart, and the two sets of the sub-masks are axis-symmetrical about the first centerline and axis-symmetrical about the second centerline, respectively.

10. The mask of claim 1, wherein the mask body has a centerline and is provided with a row of sub-masks, and
the sub-masks located on both sides of the centerline have their shield portions all facing away from the centerline, or the sub-masks located on both sides of the centerline have their shield portions all facing to the centerline.

11. The mask of claim 1, wherein the mask body has a centerline and is provided with a row of sub-masks, the sub-masks on a same side of the centerline comprises a plurality of subsets of the sub-masks, each subset of the sub-masks includes two adjacent sub-masks, and the shield portions of the two adjacent sub-masks are adjacent to each other.

12. The mask of claim 1, wherein the mask body has a centerline and is provided with multiple rows of sub-masks, and
the sub-masks located on both sides of the centerline have their shield portions all facing away from the centerline, or the sub-masks located on both sides of the centerline have their shield portions all facing to the centerline.

13. The mask of claim 1, wherein the mask body has a centerline and is provided with multiple rows of sub-masks, the sub-masks on a same side of the centerline comprises a plurality of subsets of the sub-masks, each subset of the sub-masks includes two adjacent sub-masks, and the shield portions of the two adjacent sub-masks are adjacent to each other.

14. The mask of claim 1, wherein the mask body has a first centerline and a second centerline perpendicular to each other, and the sub-masks are symmetric about the first centerline or the second centerline.

15. The mask of claim 14, wherein the first centerline is a line connecting the centers of the left and right sides and the second centerline is a line connecting the centers of upper and lower sides of the mask body, and the shield portions of the sub-masks on the same side of the second centerline are all facing to the second centerline.

16. The mask of claim 1, wherein the mask further comprises a mask frame to which the mask body is fixed.

17. The mask of claim 1, wherein the groove has a cross section that is a strip whose long side extends in the direction of a long side of the mask body.

18. The mask of claim 1, wherein the first groove covers substantially entire area of the evaporation surface, and the second groove covers substantially entire area of the glass-facing surface.

* * * * *